(12) United States Patent
Kitada et al.

(10) Patent No.: US 6,427,225 B1
(45) Date of Patent: Jul. 30, 2002

(54) METHOD AND APPARATUS FOR VERIFICATION OF A CIRCUIT LAYOUT

(75) Inventors: Osamu Kitada; Terutoshi Yamasaki; Hironobu Taoka, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/239,148

(22) Filed: Jan. 28, 1999

(30) Foreign Application Priority Data

Jul. 27, 1998 (JP) .......................................... 10-210845

(51) Int. Cl.[7] .............................................. G06F 17/50
(52) U.S. Cl. ................................................ 716/5; 716/4
(58) Field of Search .............................. 716/11, 3, 4, 5

(56) References Cited

U.S. PATENT DOCUMENTS

| | | | | |
|---|---|---|---|---|
| 5,987,240 A | * | 11/1999 | Kay ................................ | 716/5 |
| 6,038,020 A | * | 3/2000 | Tsukuda ................... | 356/237.5 |
| 6,107,207 A | * | 8/2000 | Waas et al. .................. | 438/707 |
| 6,115,546 A | * | 9/2000 | Chevallier et al. ............. | 716/5 |
| 6,128,767 A | * | 10/2000 | Chapman ....................... | 716/1 |
| 6,167,555 A | * | 12/2000 | Lakos ............................ | 716/3 |

OTHER PUBLICATIONS

Scherber et al, "Palace: A Parallel and hierarchical Layoutanalyzer and Circuit Extractor," IEEE, Mar. 1996, pp. 357–361.*

Kim et al, "Hierarchical LVS Based on Hierarchichy Rebuilding," IEEE, Feb. 1998, pp. 379–384.*

"Creating Vectors", Avant! 1997.4 Online Documentation, Four Pages, Nov. 24, 1997, Internet.

* cited by examiner

*Primary Examiner*—Vuthe Siek

(57) ABSTRACT

A semiconductor integrated circuit layout figure, inclusive of dimensional accuracy depending on the pattern shape, is efficiently verified with high accuracy. A layout verifying method for verifying whether or not a layout figure conforms to a design rule on the basis of vector data includes a reference vector classifying step for selecting and classifying a reference vector which serves as a reference for verification among vectors corresponding to sides, a verification object vector classifying step for selecting and classifying a object vector to be verified among the vectors corresponding to the sides and a verifying step for verifying a distance between each reference vector and the object vector to be verified selected among the vectors to be verified classified in correspondence with the direction of the reference vector.

12 Claims, 18 Drawing Sheets

Fig.12
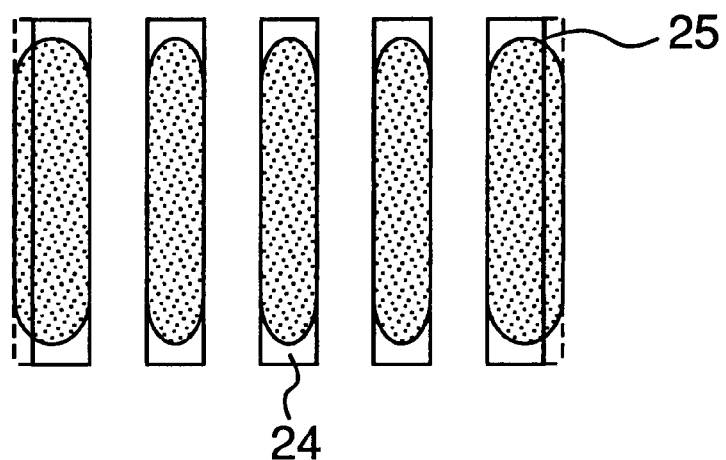
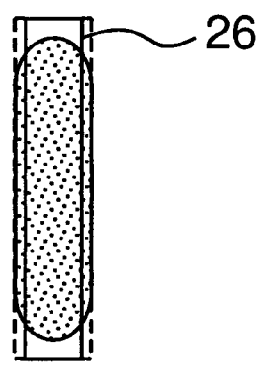

Fig.18
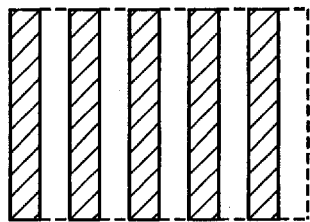 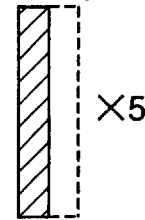
1. Flag is Set at Every Line Edge.
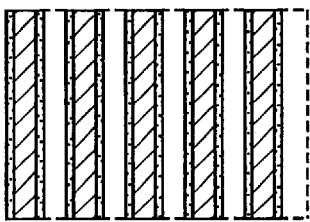 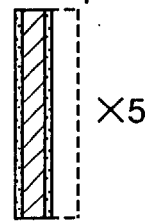
2. Flag is Set at Dense Line Edge.
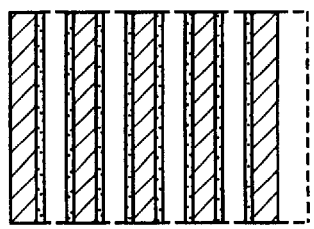 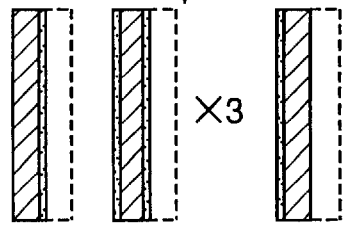
3. Output Difference Between Above Two Results.
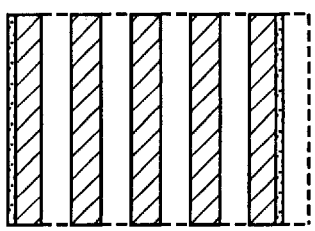 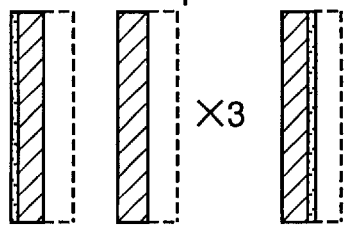

Fig.19
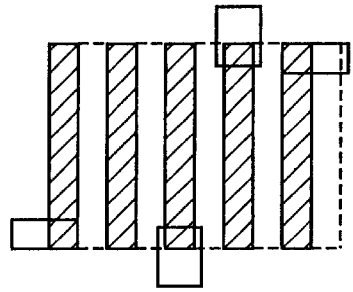 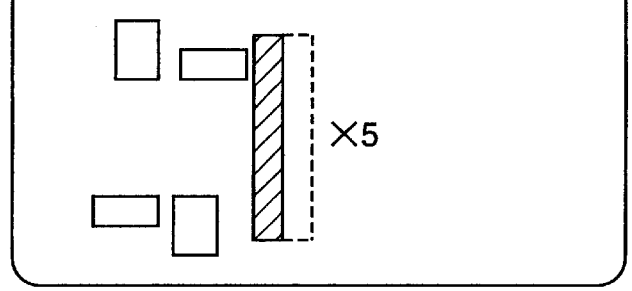
1. Flag is Set at Every Line Edge.
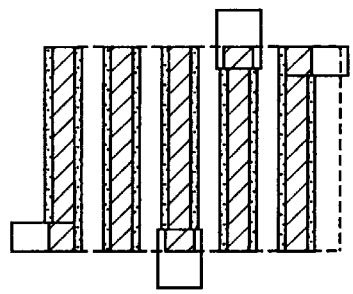 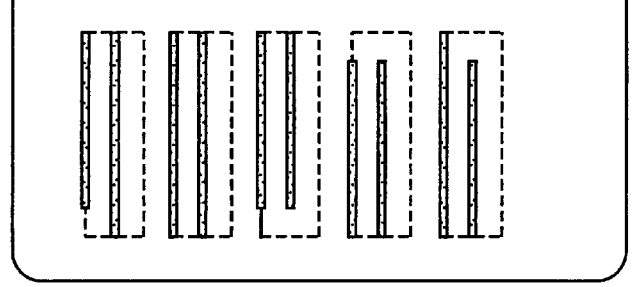
2. Flag is Set at Dense Line Edge.
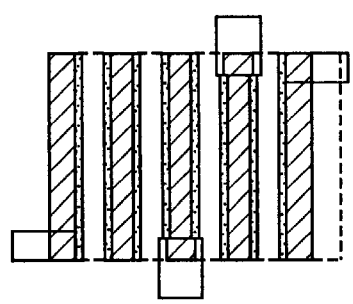 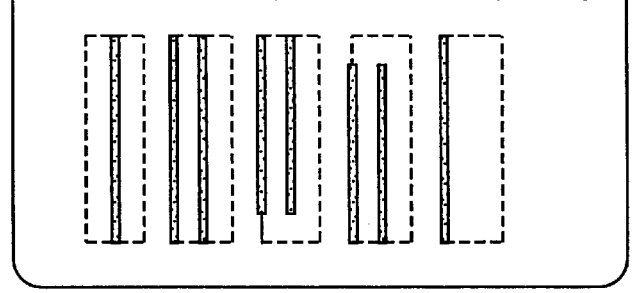

Fig.20
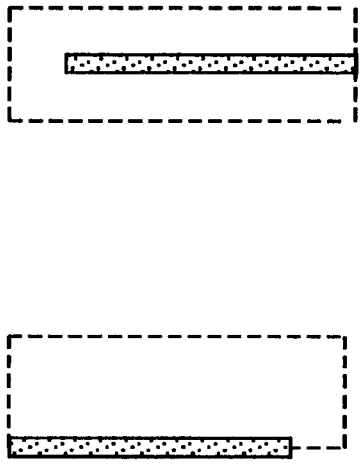
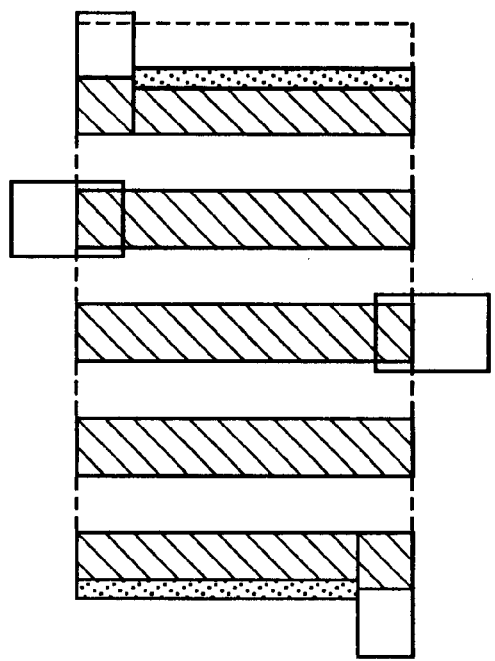

METHOD AND APPARATUS FOR VERIFICATION OF A CIRCUIT LAYOUT

BACKGROUND OF THE INVENTION

The present invention relates to a layout verifying method and layout verifying apparatus of a semiconductor integrated circuit.

In recent years, according to the microstructural progress of a semiconductor integrated circuit pattern, it has been demanded to form a pattern with high accuracy. It is known that the dimensions of a pattern on a semiconductor wafer formed by optically transferring a mask pattern on the wafer fluctuate depending on the coarseness and minuteness and the periodicity of the pattern. This variation in pattern forming accuracy due to the dimensional difference between patterns causes the deterioration in performance of a semiconductor device, posing a problem. The deterioration in pattern dimension accuracy is principally ascribed to an EB proximity effect, an optical proximity effect, an etching loading effect and so on. There has conventional been carried out mask pattern verification by a layout verifying apparatus so as not to significantly deteriorate the pattern dimensions.

FIG. 21 shows the construction of a prior art layout verifying apparatus. In a figure data input section 1, a layout figure from a layout data storing section 7 is read. A vector converting section 2 converts the layout figure into a vector description. A verifying section 5 successively selects vectors, verifies a distance to adjacent vectors according to a rule described by a verifying command 8 and outputs verification results to a verification result file 9. A verification result display section 6 displays the verification results outputted to the verification result file 9. This prior art layout verifying apparatus is to verify whether or not a design rule specified by minimum dimensions is satisfied with respect to the width of a pattern itself or an interval to the adjacent pattern.

With regard to the influence of interdependence between patterns, the verification has been simply executed by verifying a pitch defined by the sum total of the width W of the pattern itself and the interval S to the adjacent pattern as shown in FIG. 22.

However, the microstructural progress has become unable to ignore the increasing influence of the width of the adjacent pattern, the interval to the adjacent pattern and the width of the pattern on the dimensional accuracy as shown in FIG. 23. In FIG. 23, the reference numeral 21 denotes a design pattern 21, while the reference numeral 20 denotes a finished pattern on the wafer. In order to verify a pattern including the interdependence of patterns, the prior art apparatus has executed the steps of firstly selecting and extracting a pattern to be subjected to pattern dependency by arbitrary verification and verifying the pattern dependency by means of the selected extracted pattern. For example, when verifying the wiring pitch, there has been executed the steps of firstly extracting a pattern having an arbitrary pattern width and verifying the interval between the pattern and its pattern adjacent, thereby verifying whether or not the pitch is the permissible pitch. Although the microstructural progress has produced the need for pattern verification with higher accuracy, the prior art method has practically been unable to efficiently execute the verification with high accuracy.

SUMMARY OF THE INVENTION

Accordingly, the present invention has an object to provide a layout verifying method and apparatus capable of efficiently verifying with high accuracy a layout figure including inter-pattern interdependent dimensional accuracy.

In order to achieve the above object, the present invention provides a layout verifying method for converting a layout figure on a semiconductor integrated circuit into vector data by means of vectors corresponding to the sides of the layout figure and verifying whether or not the layout figure conforms to a design rule on the basis of the vector data, the method comprising:

a reference vector selecting step for selecting a reference vector which serves as a verification reference by its direction among vectors corresponding to the sides;

a verification object vector selecting step for executing search in a specified direction from the reference vector among the vectors corresponding to the sides and selecting the object vector to be verified; and a verifying step for verifying a distance between each reference vector and the object vector to be verified.

With this layout verifying method of the present invention, a layout figure, inclusive of the dimensional accuracy depending on the pattern shape, can be efficiently verified with high accuracy.

According to the layout verifying method of the present invention, it is preferable to make a new reference vector of an error vector outputted as an error in the verifying step, select a new object vector to be verified in correspondence with the new reference vector among the vectors corresponding to the sides and execute verification by the distance between the new reference vector and the new object vector to be verified corresponding to the new reference vector and a distance obtained through the above verification.

With this configuration layout figures of different design rules to be verified by the width of the adjacent pattern.

According to the layout verifying method of the present invention, it is acceptable to select the object vector to be verified on the basis of the magnitude of an angle between the object vector to be verified and the reference vector in the verification object vector selecting step. With this configuration the layout figures of different design rules that differ depending on the direction can be verified.

Furthermore, according to the layout verifying method of the present invention, it is acceptable to select the object vector to be verified on the basis of its direction and the number of vectors located between the object vector to be verified and the reference vector in the verification object vector selecting step. With this configuration the layout figure of which the design rule differs depending on the separated pattern can be verified.

Moreover, according to the layout verifying method of the present invention, it is acceptable to decide the presence or absence of an object vector to be verified within a prescribed range from the reference vector on the basis of the detected distance and output the error vector when no object vector to be verified exists within the prescribed range from the reference vector in the verifying step. With this configuration the pattern located relatively far apart from the adjacent pattern can be easily detected.

The present invention also provides a layout verifying apparatus for converting a layout figure on a semiconductor integrated circuit into vector data by means of vectors corresponding to the sides of the layout figure and verifying whether or not the layout figure conforms to a design rule on the basis of the vector data, the apparatus comprising:

a reference vector selecting section for selecting a reference vector which serves as a verification reference by its direction among vectors corresponding to the sides;

a verification object vector selecting section for executing search in a specified direction from the reference vector among the vectors corresponding to the sides and selecting the object vector to be verified; and a verifying section for verifying a distance between each reference vector and the object vector to be verified.

With this layout verifying apparatus of present invention, the layout figure, inclusive of the dimensional accuracy depending on the pattern shape, can be efficiently verified with high accuracy.

According to the layout verifying apparatus of the present invention, it is acceptable to select the object vector to be verified on the basis of the magnitude of an angle between the object vector to be verified and the reference vector in the verification object vector selecting section. In this case, for example, a vector of to be verified at an angle of 45 degrees and an object vector to be verified at an angle of −45 degrees, which are relative to the reference vector, are classified into an identical group. With this configuration, the layout figure of which the design rule differs depending on the direction can be verified.

Furthermore, according to the layout verifying apparatus of the present invention, it is acceptable to select the object vector to be verified on the basis of its direction and the number of vectors located between the object vector to be verified and the reference vector in the verification object vector selecting section. With this configuration, the layout figure having the design rule that depends on the separated pattern can be verified.

Moreover, according to the layout verifying apparatus of the present invention, it is acceptable to decide the presence or absence of an object vector to be verified within a prescribed range from the reference vector on the basis of the detected distance and output the error vector when no object vector to be verified exists within the prescribed range from the reference vector in the verifying section. With this configuration, the pattern located relatively far apart from the adjacent pattern can easily detected.

BRIEF DESCRIPTION OF THE DRAWINGS

FIG. 12 is a view showing an example of a design pattern for forming a line-and-space pattern;

FIG. 15 is a line-and-space pattern for explaining graphic processing resources and so on;

FIG. 18 is a view showing a concrete example of the hierarchical expression in the case where the figure is not superimposed on the array;

FIG. 19 is a view showing a concrete example of the hierarchical expression in the case where the figure is superimposed on the array;

FIG. 20 is a view showing the hierarchical expression by a flag;

DETAILED DESCRIPTION OF THE PREFERRED EMBODIMENTS

Preferred embodiments of the present invention will be explained below.

Figure 1:
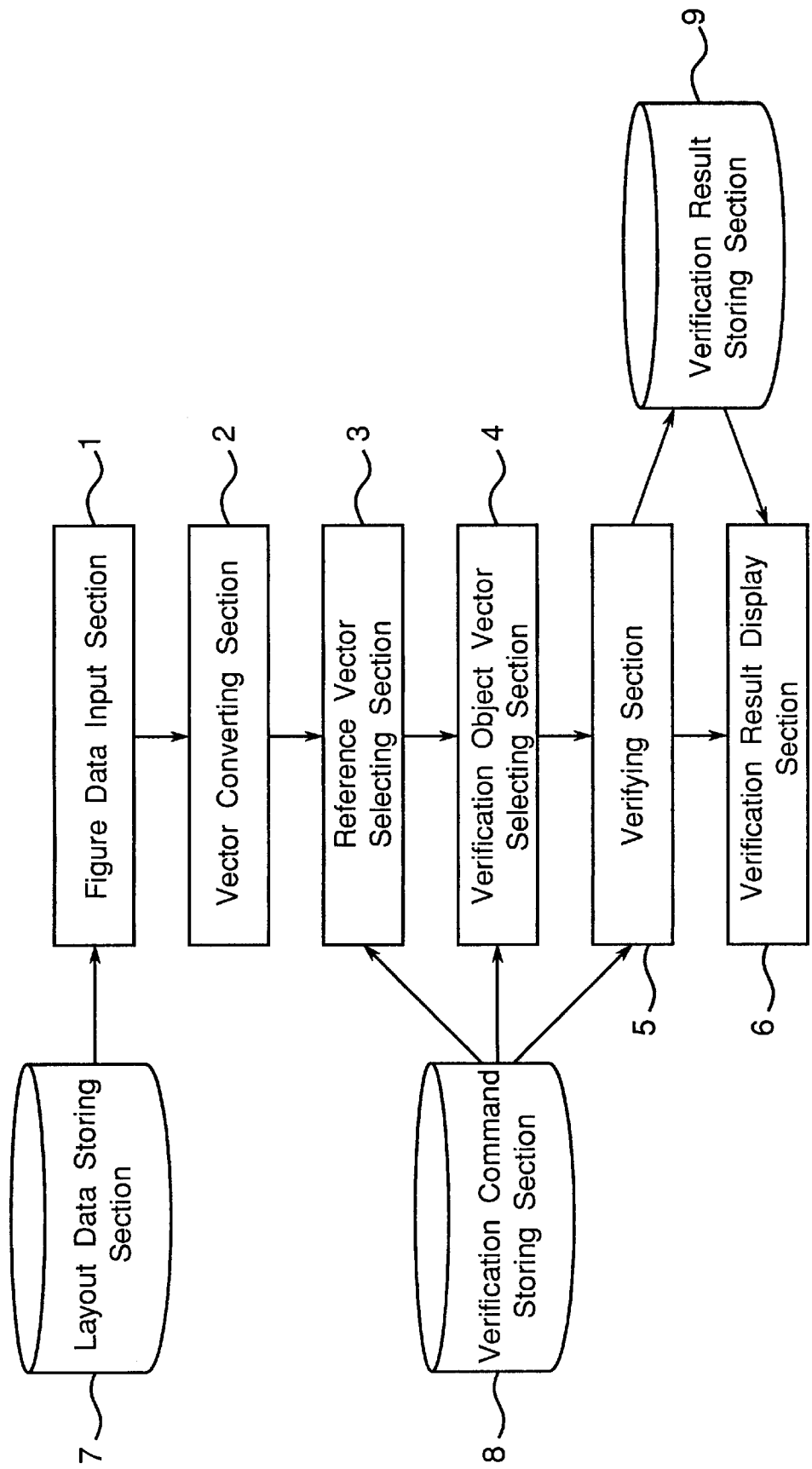
FIG. 1 is a block diagram showing the construction of a layout verifying apparatus according to an embodiment of the present invention.

A layout verifying apparatus according to the present invention is an apparatus for verifying a layout figure by making a vector description of the layout figure and verifying a positional relation between the vectors, and the apparatus is provided with the sections shown in FIG. 1.

Explaining the sections shown in FIG. 1, a figure data input section 1 reads layout figure data from a layout data storing section 7 and outputs the data to a vector converting section 2.

The vector converting section 2 converts the layout figure into a vector description and outputs the same to a reference vector selecting section 3.

Figure 2:
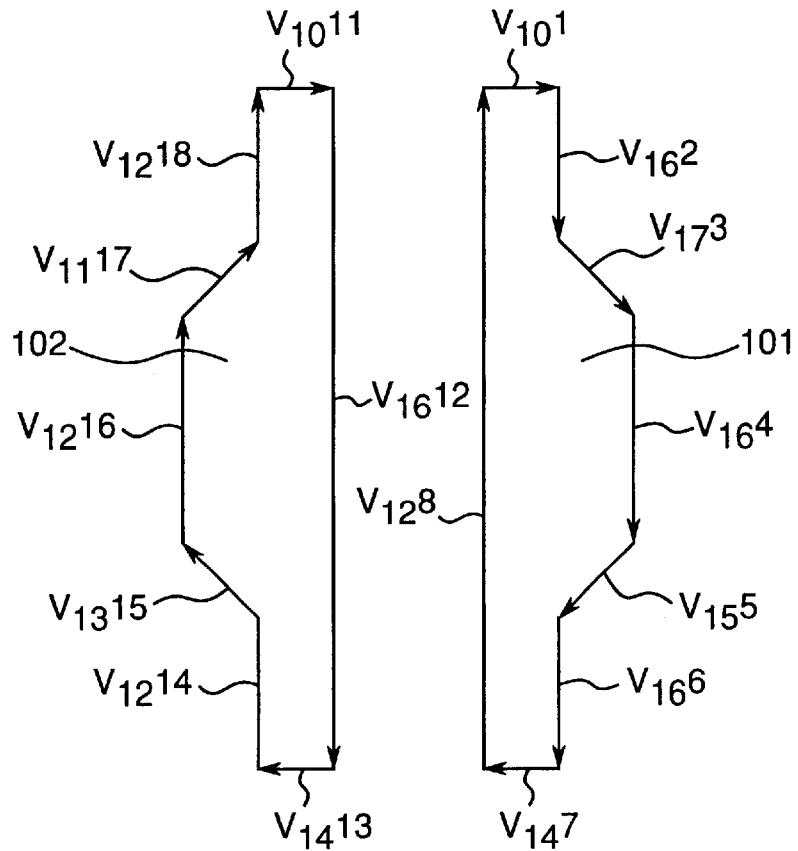
FIG. 2 is a view showing a vector description of a layout figure converted by a vector converting section in a layout verifying apparatus of the embodiment of the present invention.

In this case, with regard to the vector description of the layout figure, as shown in FIG. 2, each side of each pattern in the layout figure is described in correspondence with a vector directed so that the pattern always exists on the right-hand side of the vector direction. Therefore, a pattern 101 shown in FIG. 2 is described by vectors $V_{10}1$, $V_{16}2$, $V_{17}3$, $V_{16}4$, $V_{15}5$, $V_{16}6$, $V_{14}7$ and $V_{12}8$ corresponding to the respective sides, while a pattern 102 is described by vectors $V_{10}11$, $V_{16}12$, $V_{14}13$, $V_{12}14$, $V_{13}15$, $V_{12}16$, $V_{11}17$ and $V_{12}18$ corresponding to the respective sides. It is to be noted that the reference numerals representing vectors $V_{10}$, $V_{11}$, $V_{12}$, $V_{13}$, $V_{14}$, $V_{15}$, $V_{16}$ and $V_{17}$ mean that the vectors make angles of 0 degree, 45 degrees, 90 degrees, 135 degrees, 180 degrees, 225 degrees, 270 degrees and 315 degrees, respectively, relative to the X-axis.

If the patterns are described as described above, then distances from, for example, the vector $V_{12}8$ to the vectors $V_{16}2$, $V_{16}4$ and $V_{16}6$ located on the right-hand side represents the widths in the X-direction of the pattern 101, while a distance from the vector $V_{12}8$ to the vector $V_{16}12$ located on the left-hand side represents an interval in the X-direction between the pattern 101 and the pattern 102.

The reference vector selecting section 3 classifies vectors (reference vectors) which serve as a reference according to a command described by a verification command 8.

A verification object vector selecting section 4 classifies vectors (verification object vectors) to be verified according to a command described by the verification command 8.

The verifying section 5 verifies a distance between the reference vector and the object vector to be verified according to a command described by the verification command 8 and outputs the verification result to a verification result file 9.

A verification result display section 6 displays the verification result outputted to the verification result file 9.

The layout verifying apparatus of the embodiment constructed as above is able to verify a variety of layouts by the contents of description in the verification command storing section 8.

The following will explain the description format of the verification command storing section 8 in the layout verifying apparatus of the present embodiment.

(1) A command for classifying reference vectors is described by SELECT_VECTOR label {option} output. In this case, the "label" is the label of a vector set to be classified, and the following option is described in the place of the "option".

ANGLE=0:45:90:135:180:225:270:315[angle1,angle2]

That is, the direction of the vector to be selected is specified by the absolute angle relative to the X-axis. If the vector direction is specified by a range, then a vector of an angle that is not smaller than the "angle1" and not greater than the "angle2" is selected.

When specifying a plurality of vector directions, they are connected together with interposition of a demarcation of comma (,).

The parameter "output" specifies the destination of output of the selected vector. It is to be noted that either one of the following items can be selected as the destination of output.

MEMORY=label

This temporarily forms on a memory an output to which a label specified by the "label" is attached. This can be subsequently referred to by the "label" on another command.

FILE=filename(label)

This forms an output with a label specified by the "label" attached to the file of the name specified by the "filename".

(2) A command for verifying the distance from the object vector to be verified to the reference vector is:

DISTANCE_VECTOR label1 BY label2 {option} output

In this case, the "label1" is the label of a set to which the object vector to be verified belongs, while the "label2" is the label of a set to which the reference vector belongs. As the "option", the following option is described.

EQUATION=equation

This specifies a function formula for calculating the object value to be verified. By defining the distance from the reference vector to the object vector to be verified as DISTANCE (variable: default value of EQUATION), a formula with the variable of another label is specified. The calculation result is outputted as a DISTANCE value to the output label.

RANGE=[min, max]

This specifies a range of search (not smaller than "min" and not greater than "max") of the object vector to be verified with respect to the reference vector. This also allows specification by the DISTANCE value of another label. The infinite value is specified by LARGE.

FLAG=NORMAL:REVERSE

If the object vector to be verified exists in the range of search when NORMAL is specified, a partial vector (error vector) within the range is outputted from among the reference vectors. When REVERSE is specified, the error vector is outputted if no object vector to be verified exists in the range of search.

SEARCH=POSITIVE:NEGATIVE

Figure 3:
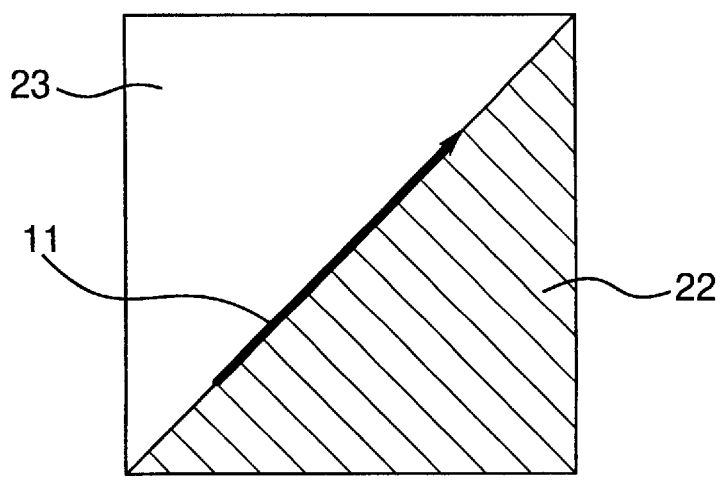
FIG. 3 is a view showing a search area of the embodiment.

This specifies the direction in which the object vector to be verified is searched from the reference vector. The POSITIVE is specified in searching the right-hand side of the vector direction, while the NEGATIVE is specified in searching the left-hand side. For example, when the POSITIVE is specified with respect to a reference vector 11 in FIG. 3, an area 22 is searched. When the NEGATIVE is specified, an area 23 is searched.

ANGLE=0:45:90:135:180:225:270:315:[angle1, angle2]

This specifies the absolute angle of the object vector to be verified relative to the X-axis. When specifying a plurality of angles, they are connected together with interposition of a demarcation of comma (,). When a range is specified, a vector of not smaller than the "angle1" and not greater than the "angle2" is verified.

RELATIVE_ANGLE=0:45:90:135:180:225:270:315: [angle1, angle2]

This specifies the relative angle of the object vector to be verified relative to the reference vector. When a range is specified, a vector of not smaller than the "angle1" and not greater than the "angle2" is verified.

LEVEL=level

This specifies the ordinal number of the object vector to be verified from the reference vector for verification.

The "output" specifies the destination of output of the error vector. The destination of output is specified in the same manner as in the case of the SELECT_VECTOR command. It is to be noted that, when an output is formed by MEMORY, by further outputting the DISTANCE value obtained by the above command for each vector and specifying the "label. DISTANCE", the "output" can be subsequently referred to by another command.

Verification examples of a variety of layout figures by means of the layout verifying apparatus of the present embodiment will be explained next.

FIRST VERIFICATION EXAMPLE

In the present first verification example, a layout figure to which the design rule shown in Table 1 and Table 2 is applied is verified.

Table 1 shows the permissible interval to the adjacent pattern with respect to the width of the pattern itself, while Table 2 shows the permissible width of the adjacent pattern with respect to the interval to the adjacent pattern. For example, if the width W of the pattern itself is in the range of $0.05\ \mu m \leq W < 0.10\ \mu m$ as shown in Table 1, then an interval S to the adjacent pattern must be in the range of $0.05\ \mu m \leq S < 0.25\ \mu m$. If the interval S to the adjacent pattern is in the range of $0.05\ \mu m \leq S < 0.10\ \mu m$ as shown in Table 2, then the width W of the adjacent pattern must be in the range of $0.05\ \mu m \leq W < 0.15\ \mu m$.

That is, the present first verification example is the example such that different design rules are applied to the adjacent pattern width.

TABLE 1

| Width W (unit: μm) | Interval S (unit: μm) | | | |
|---|---|---|---|---|
| | 0.0 < S < 0.05 | 0.05 < S < 0.10 | 0.10 ≦ S < 0.25 | 0.25 ≦ S |
| 0.0 < W < 0.05 | x | x | x | x |
| 0.05 ≦ W < 0.10 | x | ○ | ○ | x |
| 0.10 ≦ W < 0.20 | x | ○ | ○ | ○ |
| 0.20 ≦ W | x | x | ○ | ○ |

TABLE 2

| Adjacent Pattern Width W (unit: μm) | Interval S (unit: μm) | | |
|---|---|---|---|
| | 0.0 < S < 0.05 | 0.05 ≦ S < 0.10 | 0.10 ≦ S |
| 0.0 < W < 0.05 | x | x | x |
| 0.05 ≦ W < 0.10 | x | ○ | x |
| 0.10 ≦ W < 0.15 | x | ○ | ○ |
| 0.15 ≦ W | x | x | ○ |

Figure 4:
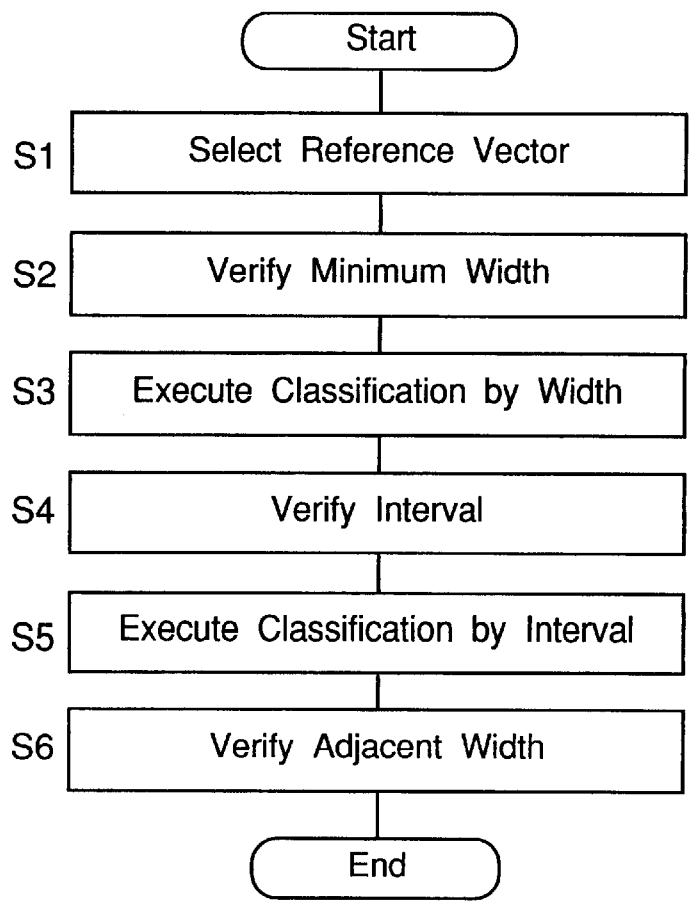
FIG. 4 is a flow chart showing the processing of a first verification example by means of a layout verifying apparatus according to an embodiment of the present invention.

The layout figure designed by the design rules as above can be verified according to a flow as shown in FIG. 4 by means of the layout verifying apparatus of the present embodiment.

First, in step S1, an upward vector (directed in a direction at an angle of 90 degrees relative to the X-axis) and a leftward vector (directed in a direction at an angle of 180 degrees relative to the X-axis) are selected as the reference vectors from a vector set LA that is the vector description of the layout figure to be verified.

In this case, a command corresponding to step S1 for executing the above processing is as follows.

SELECT_VECTOR LA{ANGLE=90,180}MEMORY= LB

Next, in step S2, a vector that is located on the positive side (on the right-hand side of the direction of each reference vector or inside the pattern) of the reference vector (each reference vector belonging to a vector set LB) selected in step S1 and is reverse to the reference vector is selected and classified as the object vector to be verified, and the distance between the reference vector and the object vector to be verified is verified, thereby verifying the minimum width. It is to be noted that the command corresponding to step S2 is as follows.

DISTANCE_VECTOR LA BY LB {
       RANGE=[0.0, 0.049]
       FLAG=NORMAL
       SEARCH=POSITIVE
       RELATIVE_ANGLE=180
       LEVEL=1
    }FILE=ERROR (101)

Next, in step S3, a vector that is located on the positive side of each reference vector belonging to the vector set LB and is reverse to the reference vector is made to serve as an object vector to be verified, and the vector is classified by a distance LC between the reference vector and the object vector to be verified.

Specifically, the vectors are classified into vectors belonging to a vector set LC1 in a range of 0.05≦distance LC<0.1, vectors belonging to a vector set LC2 in a range of 0.10≦distance LC<0.2 and vectors belonging to a vector set LC3 in a range of 0.20≦distance LC.

The command corresponding to this step S3 is as follows.

DISTANCE_VECTOR LA BY LB {
       RANGE=[0.05, 0.099]
       FLAG=NORMAL
       SEARCH=POSITIVE
       RELATIVE_ANGLE=180
       LEVEL=1
    }MEMORY=LC1
    DISTANCE_VECTOR LA BY LB {
       RANGE=[0.10, 0.199]
       FLAG=NORMAL
       SEARCH=POSITIVE
       RELATIVE_ANGLE=180
       LEVEL=1
    }MEMORY=LC2
    DISTANCE_VECTOR LA BY LB {
       RANGE=[0.20, LARGE]
       FLAG=NORMAL
       SEARCH=POSITIVE
       RELATIVE_ANGLE=180
       LEVEL=1
    }MEMORY=LC3

Further, in step S4, vector that are located on the negative side (on the left-hand side of the direction of each reference vector or outside the pattern) of the reference vectors belonging to the vector sets LC1 through LC3 and are reverse to the reference vectors are made to serve as the object vectors to be verified, and the interval is verified by the distance.

The command in step S4 is as follows.

DISTANCE_VECTOR LA BY LC1 {
       RANGE=[0.05, 0.249]
       FLAG=REVERSE
       SEARCH=NEGATIVE
       RELATIVE_ANGLE=180
       LEVEL=1
    }FILE=ERROR (102)
    DISTANCE_VECTOR LA BY LC2 {
       RANGE=[0.0, 0.049]
       FLAG=NORMAL
       SEARCH=NEGATIVE
       RELATIVE_ANGLE=180
       LEVEL=1
    }FILE=ERROR (103)
    DISTANCE_VECTOR LA BY LC3 {
       RANGE=[0.0, 0.099]
       FLAG=NORMAL
       SEARCH=NEGATIVE
       RELATIVE_ANGLE=180
       LEVEL=1
    }FILE=ERROR (104)

Further, in step S5, vectors that are located on the negative side of the reference vectors belonging to the vector sets LC1 through LC3 and are reverse to the reference vectors are made to serve as the object vectors to be verified, and the vectors are classified by the distance LD.

Specifically, the vectors are classified into vectors belonging to a vector set LD11 in a range of 0.05≦distance LD<0.1 and vectors belonging to a vector set LD12 in a range of 0.10≦distance LD.

The command in step S5 is shown. It is to be noted that only the command of LC1 is shown here.

DISTANCE_VECTOR LA BY LC1 {
       RANGE=[0.05, 0.099]
       FLAG=NORMAL

```
    SEARCH=NEGATIVE
    RELATIVE_ANGLE=180
    LEVEL=1
}MEMORY=LD11
DISTANCE_VECTOR LA BY LC1 {
    RANGE=[0.1, LARGE]
    FLAG=NORMAL
    SEARCH=NEGATIVE
    RELATIVE_ANGLE=180
    LEVEL=1
}MEMORY=LD12
```

In step S6, the vector sets LD11 through LD32 are made to serve as the reference vector, and the vector located in the second position on the negative side of the reference vector is made to serve as the object vector to be verified. Then, the adjacent pattern width is verified by obtaining a value derived by subtracting a distance between the reference vector and the adjacent reference vector on the negative side of the reference vector from the distance between the reference vector and the object vector to be verified.

The command corresponding to step S6 is shown below. In this case, only the command of LD11 is shown here.

```
DISTANCE_VECTOR LA BY LD11 {
    EQUATION=DISTANCE-LD11. DISTANCE
    RANGE=[0.05, 0.149]
    FLAG=REVERSE
    SEARCH=NEGATIVE
    RELATIVE_ANGLE=0
    LEVEL=2
}FILE=ERROR (105)
```

As explained in connection with the above first verification example, a layout figure to which different design rules are applied can be verified in correspondence with the adjacent pattern width by means of the layout figure verifying apparatus of the embodiment.

SECOND VERIFICATION EXAMPLE

The second verification example is the example such that the pattern pitch is verified with high accuracy by the layout verifying apparatus of the present invention. In the second verification example, the design rule of pitch verification is set as follows.

TABLE 3

| Pattern Width: W | Pitch: P |
|---|---|
| $0.10 \leq W < 0.18$ | $P \geq 0.26$ |
| $0.18 \leq W < 0.24$ | $P \geq 0.34$ |
| $0.24 \leq W < 0.30$ | $P \geq 0.42$ |

Figure 5:
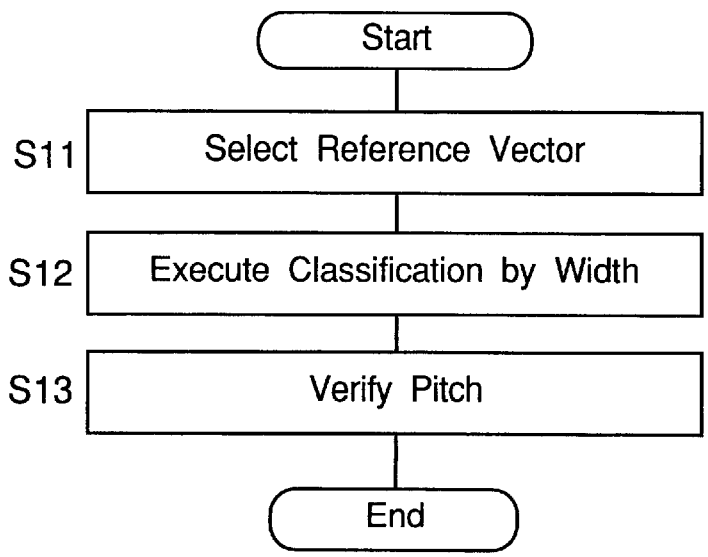
FIG. 5 is a flow chart showing the processing of a second verification example by means of a layout verifying apparatus according to an embodiment of the present invention.

The verification of this design rule is executed according to a flow as shown in FIG. 5.

First, in step S11, an upward vector and a leftward vector are selected from the vector set LA to be verified and made to serve as the reference vector.

The command corresponding to this step S11 is shown below.

```
SELECT_VECTOR LA {
    ANGLE=90, 180
}MEMORY=LB
```

Next, in step S12, a vector that is located on the positive side of the reference vector belonging to the vector set LB and is reverse to the reference vector is made to serve as the object vector to be verified and then classified by the distance. In this case, the above distance corresponds to the pattern width W, and the vectors are specifically classified into those in a range of $010 \leq W < 0.18$, those in a range of $0.18 \leq W < 0.24$ and those in a range of $0.24 \leq W < 0.30$.

The command corresponding to step S12 for executing the above processing is shown below.

```
DISTANCE_VECTOR LA BY LB {
    RANGE=[0.1, 0.179]
    FLAG=NORMAL
    SEARCH=POSITIVE
    RELATIVE_ANGLE=180
    LEVEL=1
}MEMORY=LC1
DISTANCE_VECTOR LA BY LB {
    RANGE=[0.18, 0.239]
    FLAG=NORMAL
    SEARCH=POSITIVE
    RELATIVE_ANGLE=180
    LEVEL=1
}MEMORY=LC2
DISTANCE_VECTOR LA BY LB {
    RANGE=[0.24, 0.299]
    FLAG=NORMAL
    SEARCH=POSITIVE
    RELATIVE_ANGLE=180
    LEVEL=1
}MEMORY=LC3
```

In step S13, vectors that are located on the negative side (on the left-hand side of the upward reference vector and on the lower side of the leftward reference vector) of the reference vectors belonging to the vector sets LC1 through LC3 and are reverse to the reference vectors are extracted as the object vector to be verified. Next, the distance between the reference vector and the corresponding object vector to be verified (inter-pattern interval) is calculated.

Then, the minimum interval is first extracted by the calculated distance, and a pitch is calculated and verified by means of the pattern widths owned by LC1 through LC3.

The command corresponding to step S3 is shown below.

```
DISTANCE_VECTOR LB BY LC1 {
    EQUATION=DISTANCE+LC1. DISTANCE
    RANGE=[0.0, 0.259]
    FLAG=NORMAL
    SEARCH=NEGATIVE
    RELATIVE_ANGLE=180
    LEVEL=1
}FILE=ERROR (101)
DISTANCE_VECTOR LB BY LC2 {
    EQUATION=DISTANCE+LC2. DISTANCE
    RANGE=[0.0, 0.339]
    FLAG=NORMAL
    SEARCH=NEGATIVE
    RELATIVE_ANGLE=180
    LEVEL=1
}FILE=ERROR (102)
DISTANCE_VECTOR LB BY LC3 {
    EQUATION=DISTANCE+LC3. DISTANCE
    RANGE=[0.0, 0.419]
    FLAG=NORMAL
    SEARCH=NEGATIVE
    RELATIVE_ANGLE=180
    LEVEL=1
}FILE=ERROR (103)
```

With the above arrangement, the pitch value is calculated and verified by means of the DISTANCE value (pattern width) when LC is extracted and selected. Therefore, the verification can be executed with higher accuracy than the prior art method for verifying the interval between patterns after extracting and selecting the pattern of a pattern width in an arbitrary range.

As described above, the layout verifying apparatus of the present embodiment can verify with high accuracy the layout figure in the case where the pitch of the permissible pattern differs in correspondence with the pattern width.

THIRD VERIFICATION EXAMPLE

The third verification example is the verification example executed by means of the layout verifying apparatus of the present invention in the case where the permissible minimum dimensions differ between the X-direction and the Y-direction.

Figure 6:
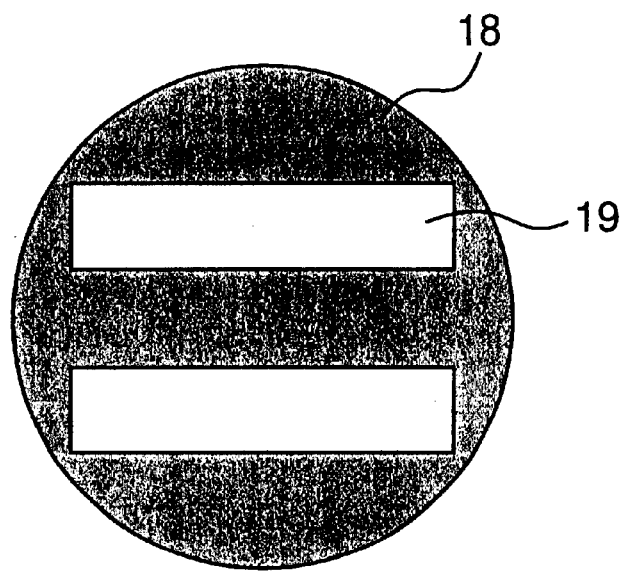
FIG. 6 is a view showing an example of an aperture to be used for an exposure device.
Figure 7:
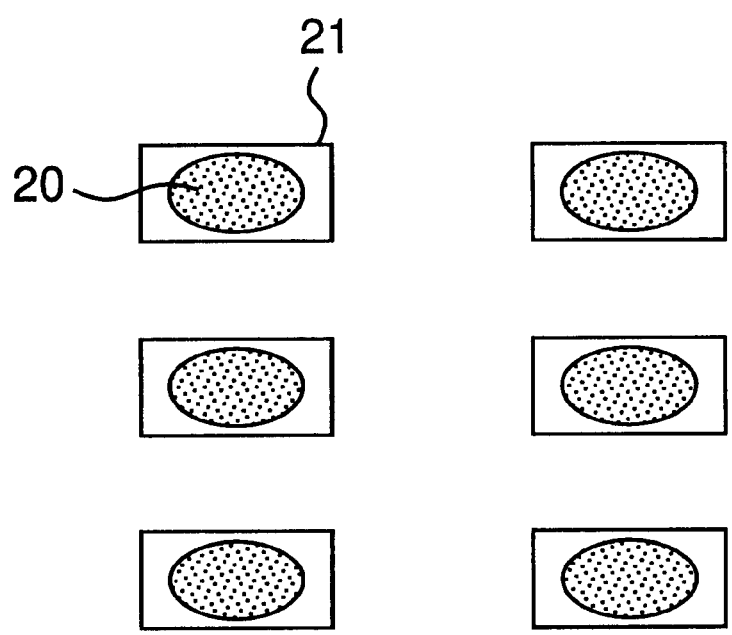
FIG. 7 is a view showing an example of a minute contact hole.

It is known that a fine pattern (thin lines and narrow intervals) can be resolved by using a modified illumination such that the illumination of an exposure device is partially shaded. However, if such an arrangement is adopted, then the permissible minimum dimensions differ between the X-direction and the Y-direction. FIG. 6 shows an example of a shading object (aperture) to be used for the modified illumination. In FIG. 6, the reference numeral 18 denotes a shading portion 18, while the reference numeral 19 denotes an opening portion. When the aperture of FIG. 6 is used, the resolution of a fine pattern in the Y-direction (pattern in which the width in the Y-direction is small and the interval in the Y-direction is narrow) is improved. However, no improvement is observed with regard to the fine pattern in the X-direction (pattern in which the width in the X-direction is small and the interval in the X-direction is narrow). For example, a contact hole 20 of which the length and interval in the Y-direction are small as shown in FIG. 7 can be formed. In the case where transfer is executed by means of the modified illumination employing the aperture shown in FIG. 6, a minimum dimension Lx in the X-direction and a minimum dimension Ly in the Y-direction differ from each other, and Ly is smaller than Lx.

By using the layout verifying apparatus of the present invention, the verification in the case where the design rules differ between the X-direction and Y-direction can be executed.

The design rule is defined as follows in the explanation hereinbelow. It is assumed that no inclined pattern exists.

Minimum line width in X-direction=0.5
Minimum interval in X-direction=0.4
Minimum line width in Y-direction=0.34
Minimum interval in Y-direction=0.32

Figure 8:
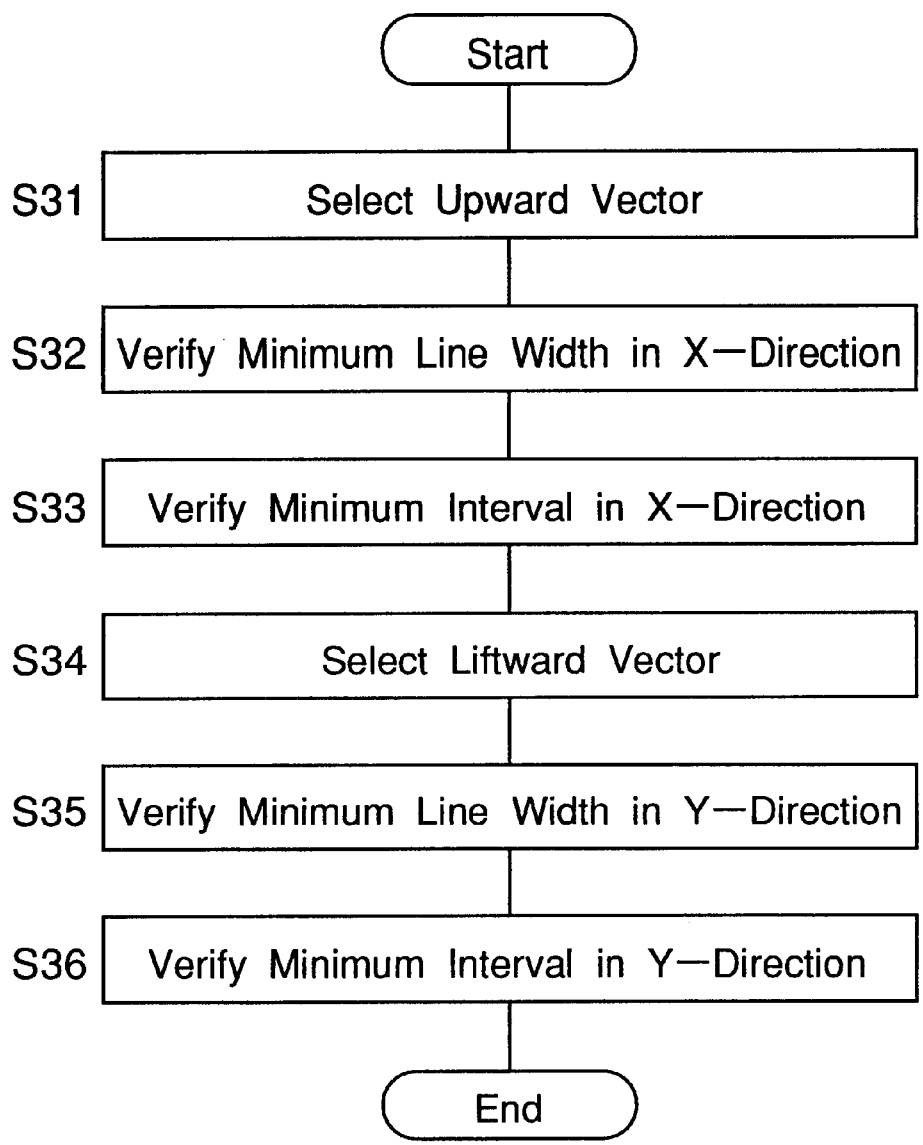
FIG. 8 is a flow chart showing the processing of a third verification example by means of a layout verifying apparatus according to an embodiment of the present invention.

The flow for verifying this design rule is shown in FIG. 8. In step S31, an upward vector is selected as the reference vector from the vector set LA to be verified.

The command corresponding to this step S31 is shown below.

SELECT_VECTOR LA {
   ANGLE=90
}MEMORY=LB

Next, in step S32, a downward vector that is located adjacently on the right-hand side of the reference vector belonging to the vector set LB is made to serve as the object vector to be verified, and the minimum line width in the X-direction is verified by the distance between the reference vector and the object vector to be verified.

The command corresponding to step S32 is shown below.
DISTANCE_VECTOR LA BY LB {
   RANGE=[0, 0.4999]
   FLAG=NORMAL
   SEARCH=POSITIVE
   ANGLE=270
   LEVEL=1
}FILE=ERROR (101)

Next, in step S33, a downward vector that is located adjacently on the left-hand side of the reference vector belonging to the vector set LB is made to serve as the object vector to be verified, and the minimum interval in the X-direction is verified by the distance between the reference vector and the object vector to be verified.

The command corresponding to step S33 is shown below.
DISTANCE_VECTOR LA BY LB {
   RANGE=[0, 0.3999]
   FLAG=NORMAL
   SEARCH=NEGATIVE
   ANGLE=270
   LEVEL=1
}FILE=ERROR (102)

In step S34, a leftward vector is selected from the vector set LA to be verified and made to serve as the reference vector.

The command corresponding to step S34 is shown below.
SELECT_VECTOR LA {
   ANGLE=180
}MEMORY=LC In step S35, a rightward vector that is located adjacently on the upper side (on the right-hand side of the vector direction) of the reference vector belonging to the vector set LC is made to serve as the object vector to be verified, and the minimum line width in the Y-direction is verified by the distance between the reference vector and the object vector to be verified.

The command corresponding to step S35 is shown below.
DISTANCE_VECTOR LA BY LC {
   RANGE=[0, 0.3399]
   FLAG=NORMAL
   SEARCH=POSITIVE
   ANGLE=0
   LEVEL=1
}FILE=ERROR (103)

In step S36, a rightward vector that is located adjacently on the lower side (on the left-hand side of the vector direction) of the reference vector belonging to the vector set LC is made to serve as the object vector to be verified, and the minimum interval in the Y-direction is verified by the distance.

The command corresponding to step S36 is shown below.
DISTANCE_VECTOR LA BY LC {
   RANGE=[0, 0.3199]
   FLAG=NORMAL
   SEARCH=NEGATIVE
   ANGLE=0
   LEVEL=1
}FILE=ERROR (104)

As described above, the layout verifying apparatus of the present embodiment can verify with high accuracy the layout figure in the case where the permissible minimum dimensions differ between the X-direction and the Y-direction.

FOURTH VERIFICATION EXAMPLE

The fourth verification example is the verification example in the case where the resolution in the perpendicular direction (X-direction or Y-direction) is superior to the resolution in the oblique direction.

Figure 9:
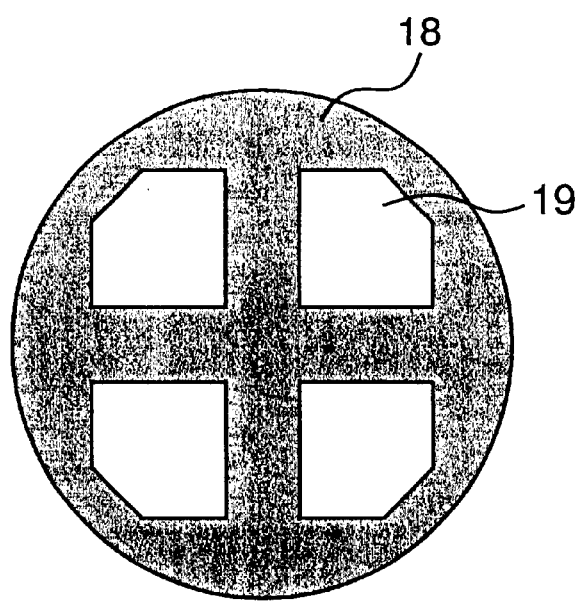
FIG. 9 is a view showing another example of the aperture to be used for the exposure device.

For example, when the aperture shown in FIG. 9 is employed, the resolution of the minute pattern in the perpendicular direction (X-direction or Y-direction) is improved, however, the improvement in resolution in the oblique direction is small. Therefore, the minimum dimension in the oblique direction is greater than the minimum dimension in the perpendicular direction.

The prior art verifying apparatus has not been able to verify the design rule such that the minimum dimension in the oblique direction is greater than the minimum dimension in the perpendicular direction as described above. However, the layout verifying apparatus of the present invention can execute the above-mentioned verification even in the case where the design rules differ between the perpendicular direction and the oblique direction. An example of the above is shown below.

The design rule in the fourth verification example is defined as follows. In this case, the oblique direction means the direction (direction at an angle of 45 degrees) intermediate between the X-direction and the Y-direction.

Minimum line width in perpendicular direction: 0.34

Minimum interval in perpendicular direction: 0.32

Minimum line width in oblique direction: 0.5

Minimum interval in oblique direction: 0.4

Figure 10:
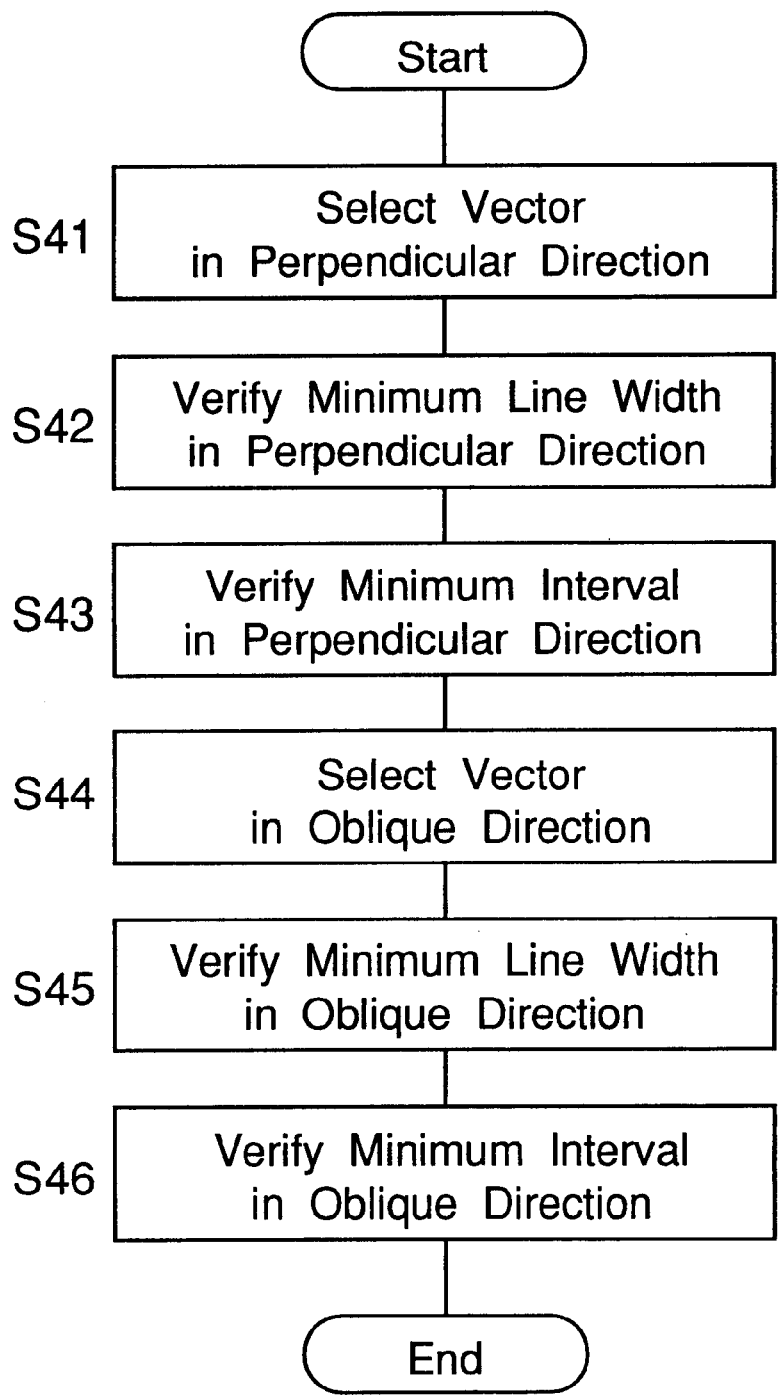
FIG. 10 is a flow chart showing the processing of a fourth verification example by means of a layout verifying apparatus according to an embodiment of the present invention.

The above design rule can be verified according to the flow shown in FIG. 10. In step S41 of the flow shown in FIG. 10, upward and leftward vectors are selected as the reference vectors from the vector set LA to be verified.

The command corresponding to step S41 is shown below.

SELECT_VECTOR LA {
　ANGLE=90, 180
}MEMORY=LD

Next, in step S42, a reverse vector that is located on the positive side (on the right-hand side of the vector direction) of the reference vector belonging to the vector set LD is selected as the object vector to be verified, and the minimum line width in the perpendicular direction is verified by the distance between the reference vector and the object vector to be verified.

The command corresponding to step S42 is shown below.

DISTANCE_VECTOR LA BY LD {
　RANGE=[0, 0.3399]
　FLAG=NORMAL
　SEARCH=POSITIVE
　RELATIVE_ANGLE=180
　LEVEL=1
}FILE=ERROR (105)

In step S43, a reverse vector that is located on the negative side (on the left-hand side of the vector direction) of the reference vector belonging to the vector set LD is selected as the object vector to be verified, and the minimum interval in the perpendicular direction is verified by the distance between the reference vector and the object vector to be verified.

The command corresponding to step S43 is shown below.

DISTANCE_VECTOR LA BY LD {
　RANGE=[0, 0.3199]
　FLAG=NORMAL
　SEARCH=NEGATIVE
　RELATIVE_ANGLE=180
　LEVEL=1
}FILE=ERROR (106)

In step S44, a vector directed upwardly rightward and a vector directed upwardly leftward are selected as the reference vector from the vector set LA to be verified.

The command corresponding to step S44 is shown below.

SELECT_VECTOR LA {
　ANGLE=45, 135
}MEMORY=LE

In step S45, a reverse vector that is located on the positive side of the reference vector belonging to the vector set LE is selected as the object vector to be verified, and the minimum line width in the oblique direction is verified by the distance between the reference vector and the object vector to be verified.

The command corresponding to step S45 is shown below.

DISTANCE_VECTOR LA BY LE {
　RANGE=[0, 0.4999]
　FLAG=NORMAL
　SEARCH=POSITIVE
　RELATIVE_ANGLE=180
　LEVEL=1
}FILE=ERROR (107)

In step S46, a reverse vector that is located on the negative side of the reference vector belonging to the vector set LE is selected as the object vector to be verified, and the minimum interval in the oblique direction is verified by the distance between the reference vector and the object vector to be verified.

The command corresponding to step S46 is shown below.

DISTANCE_VECTOR LA BY LE {
　RANGE=[0, 0.3999]
　FLAG=NORMAL
　SEARCH=POSITIVE
　RELATIVE_ANGLE=180
　LEVEL=1
}FILE=ERROR (108)

As described above, the layout verifying apparatus of the present embodiment can verify with high accuracy the layout figure in the case where the resolution in the perpendicular direction (X-direction or Y-direction) is superior to the resolution in the oblique direction.

FIFTH VERIFICATION EXAMPLE

Figure 11:
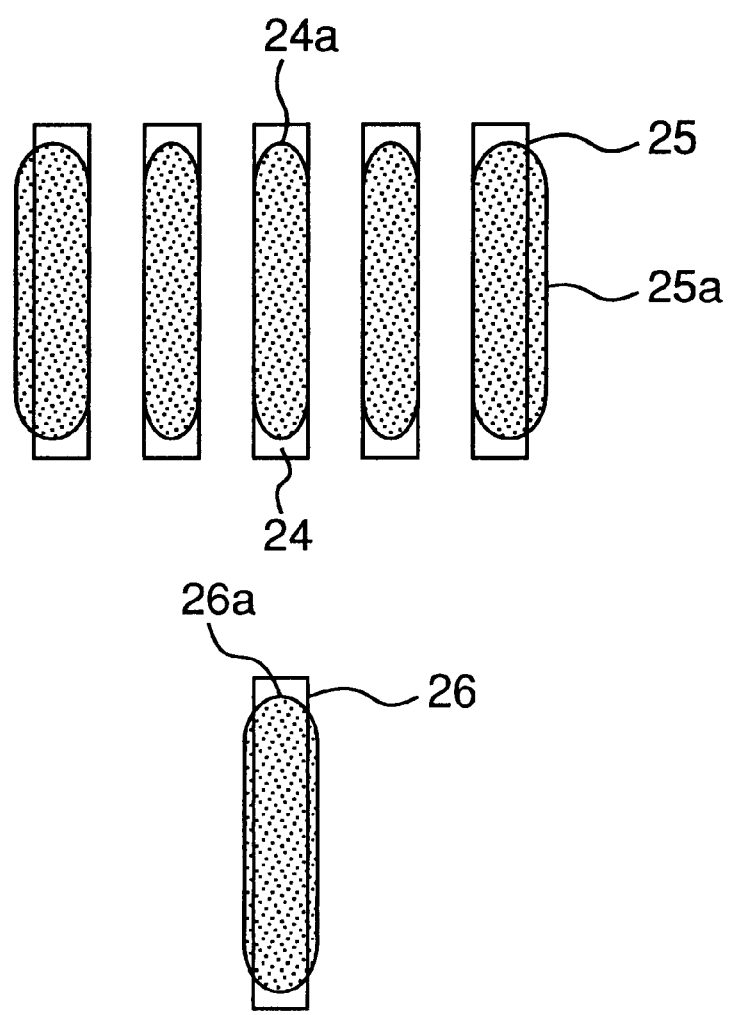
FIG. 11 is a view showing an example of a line-and-space pattern.

In general, there is a difference in dimensional accuracy between the center portion and both end portions or the periphery of a line-and-space pattern. The present fifth verification example is the verification example in such a case. For example, as shown in FIG. 11, the line width of the center portion 24 of the line-and-space pattern is finished almost in conformity to the design pattern, whereas a dimensional difference occurs between the design pattern and the finish pattern in both line-and-space pattern end portions 25 and an isolated pattern portion 26. In this case, the rectangular frames 24, 25 and 26 show the design patterns, while the reference numerals 24a, 25a and 26a show the pattern formed (finished) by lithography. The above problem can be solved by correcting the design patterns of both the line-and-space pattern end portions and the isolated pattern portion as shown in FIG. 12. In FIG. 12, the dashed lines show the pattern before correction, the solid lines show the pattern after correction and the gray portions show the finished pattern shape.

In order to detect such a sparse pattern, it is required to extract a reference vector that has no adjacent vector within a prescribed range around the reference vector.

However, the prior art layout verifying apparatus has been able to describe the rule of outputting a flag to the reference vector when an object vector to be verified exists with respect to the reference vector, whereas the apparatus has not been able to describe the rule of outputting a flag to the reference vector when no object vector to be verified exists. Therefore, extraction of a vector group having no adjacent vector within a prescribed range has been required to be executed according to either one of the following methods.

1. A vector of which the distance to the adjacent vector is greater than a prescribed value is extracted (first prior art method).

2. All the vectors are extracted and thereafter vectors each having an adjacent vector within a prescribed range are removed from this figure set (second prior art method).

The problems of these prior art methods will be described in more detail.

Problem of First Prior Art Method

Assuming that the sparse condition is defined as the case where the distance to the adjacent vector is greater than Smin, then the description of the verification rule for detecting a vector in a sparse state is as follows.

"Extract a vector of which the interval to the adjacent vector is greater than Smin."

Figure 14:
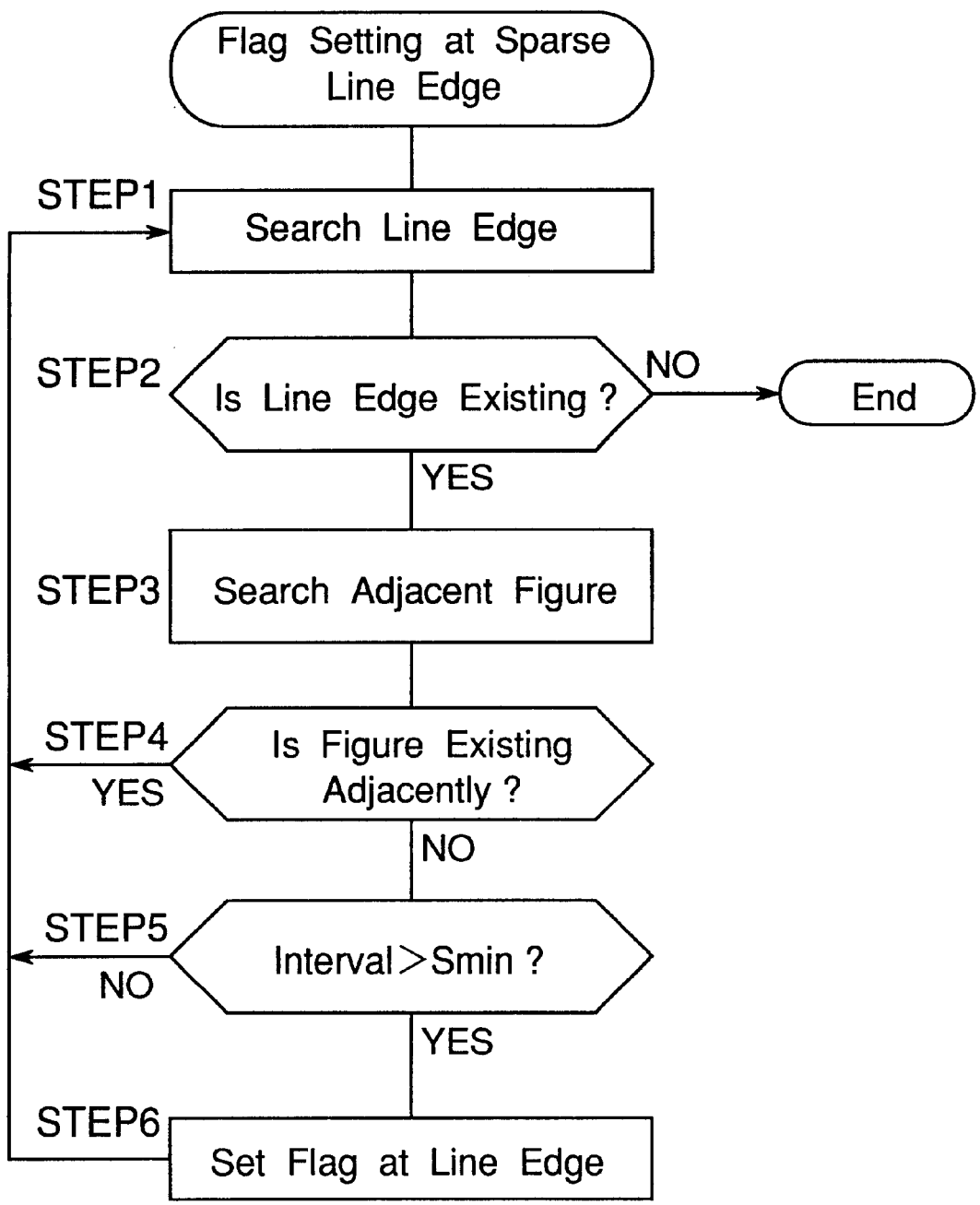
FIG. 14 is a flow chart showing the processing of a first prior art method.

This description is practically executed by the first prior art method according to the flow shown in FIG. 14. According to this flow, the measure to be taken is to continue searching until the adjacent vector is detected in STEP3, obtain the interval between vectors and output a flag only when the interval is greater than Smin. This method has had the problem that the search must be executed on the whole layout in the worst case until adjacent vectors are searched.

Problem of Second Prior Art Method

In order to extract a vector in a sparse state by the second prior art method, the extraction is to be executed by a verification rule as follows.

"Extract all the vectors. Extract vectors in a dense state (in which the inter-vector interval is not greater than Smin). Then, extract vectors obtained by excluding the vectors in a dense state from all the vectors."

As described above, the extraction of vectors that do not satisfy a prescribed condition can be executed by excluding the vectors that satisfy the condition from the set of all the vectors.

However, this method has had the problem that the hierarchical structure is not maintained when another figure is superimposed on the array section and a vast amount of graphic processing resources (storage capacity and processing time) are necessitated.

Figure 15:
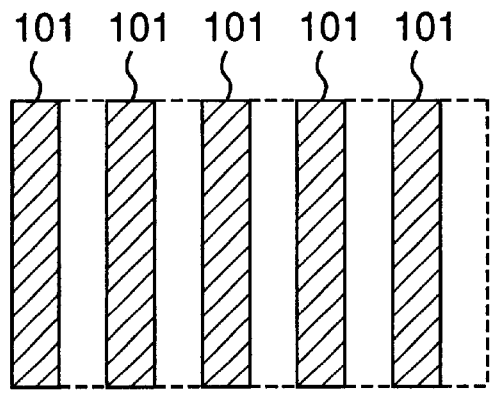
Figure 16:
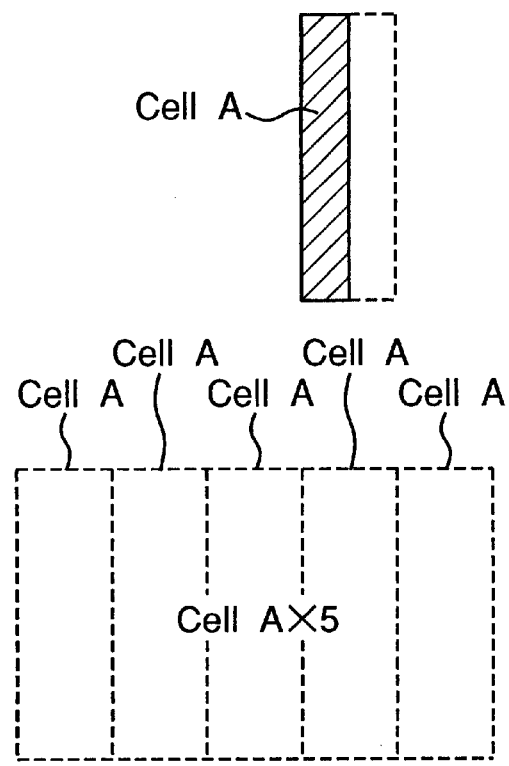
FIG. 16 is a view for explaining a hierarchical expression.

The following will describe the relation of the maintenance of the hierarchical structure to the graphic processing resources and the necessity for maintaining the hierarchical structure. FIG. 15 shows an example of the line-and-space pattern. This is an array in which same five rectangular patterns 101 are arranged. The hierarchical representation of this array is shown in FIG. 16. The array shown in FIG. 15 can be represented by being separated into the graphic information of a cell A and the array information of the arrangement of the five cells A as shown in FIG. 16. In order to handle a figure set in which a specific figure unit repetitively appears as in the case of the semiconductor device pattern, the graphic processing resources can be further reduced by using the hierarchical representation as shown in FIG. 16 than separately storing and processing the individual graphic information as shown in FIG. 15.

The reduction in the graphic processing resources means the cost reduction of the computer and use of the computer as well as the cost reduction of the storage device, storage media for storing data and communications with transfer of data, and therefore, how to execute the graphic processing while maintaining the hierarchical structure is practically important.

Figure 17:
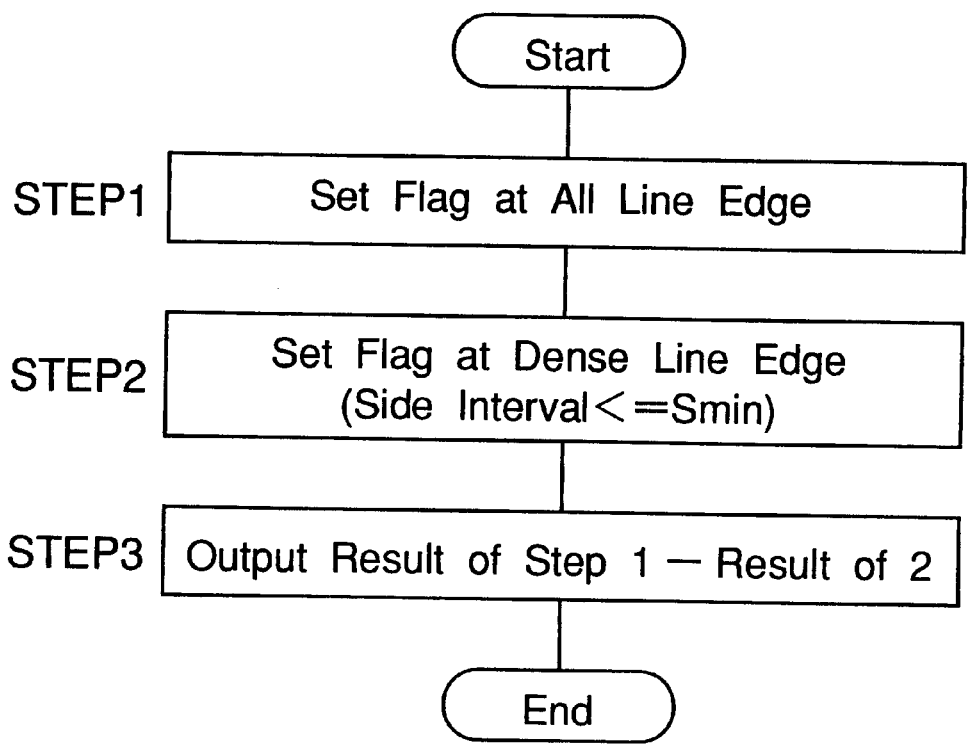
FIG. 17 is a flow chart for processing the hierarchical expression.
Figure 21:
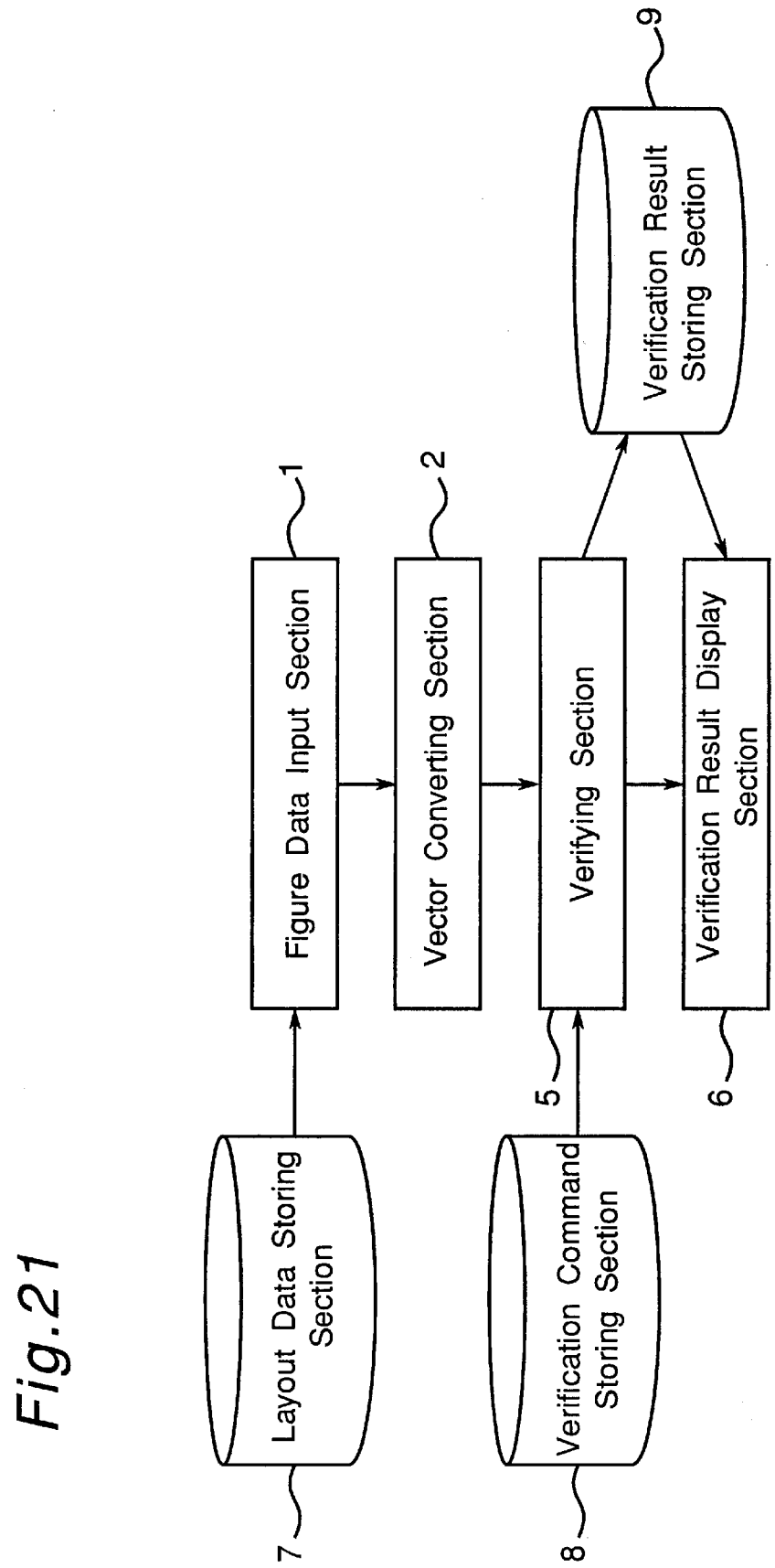
FIG. 21 is a block diagram showing the construction of a prior art layout verifying apparatus.
Figure 22:
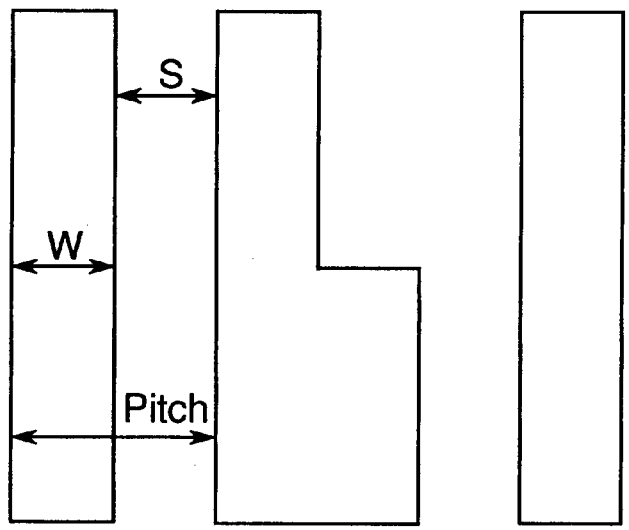
FIG. 22 is a view showing a pattern width, a pattern interval and a pitch to be verified by the prior art layout verifying apparatus.
Figure 23:
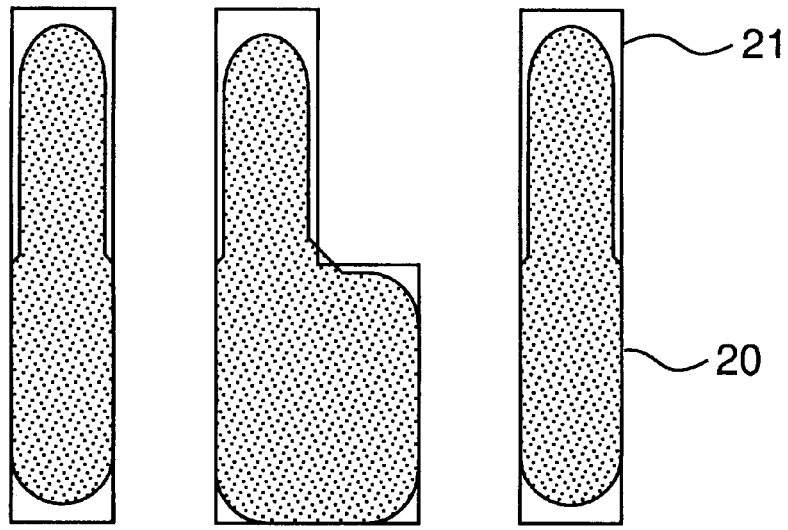
FIG. 23 is a view for explaining the influence of the adjacent pattern width and pattern interval on dimensional accuracy.

How the figure and the hierarchical representation thereof vary will be described according to the flow shown in FIG. 17. FIG. 18 shows a concrete example in the case where no other figure is superimposed on the array. It can be appreciated that only the vectors at both ends of the line-and-space pattern can be extracted by executing the processing according to the flow of FIG. 17. Then, it can be appreciated that the hierarchical structure is almost maintained in this case. In contrast to this, a concrete example in which another figure is superimposed on the array is shown in FIG. 19. In the stage before the processing, the whole figure can be represented by the information of one cell, the information of one array and the graphic information of other than four arrays. However, the superimposition of the figure except for the array on the array must be taken into consideration in the state in which a flag is outputted to all the lines in STEP1, and therefore, the hierarchical structure is not maintained in the outputted flag.

Likewise, the hierarchy is not maintained also in the case where a flag is outputted to a line edge in a dense state in STEP2. In STEP3, a differential calculation between the two figure sets in which the hierarchical structure is not maintained is executed. When the number of repetition is great, this processing causes a problem that a vast amount of graphic processing resources are necessitated. The result of processing in STEP3 is shown in FIG. 20. As described above, it can be appreciated that it is sometimes the case where a vast amount of graphic processing resources are necessitated through the process of executing the differential calculation with respect to the whole figure.

Accordingly, there is necessitated a layout verifying apparatus that can describe the verification rule for outputting an error vector to the reference vector when no object vector to be verified exists with respect to the reference vector.

If the mask pattern verifying apparatus according to the present invention is used, then a verification rule for outputting an error vector to the reference vector when no object vector to be verified exists with respect to the reference vector can be described.

That is, according to the layout verifying apparatus of the present invention, the rule of the verification file 7 is able to have the description: "Output a flag to the reference vector when no other figure exists within the range of Smin from the reference vector".

Figure 13:
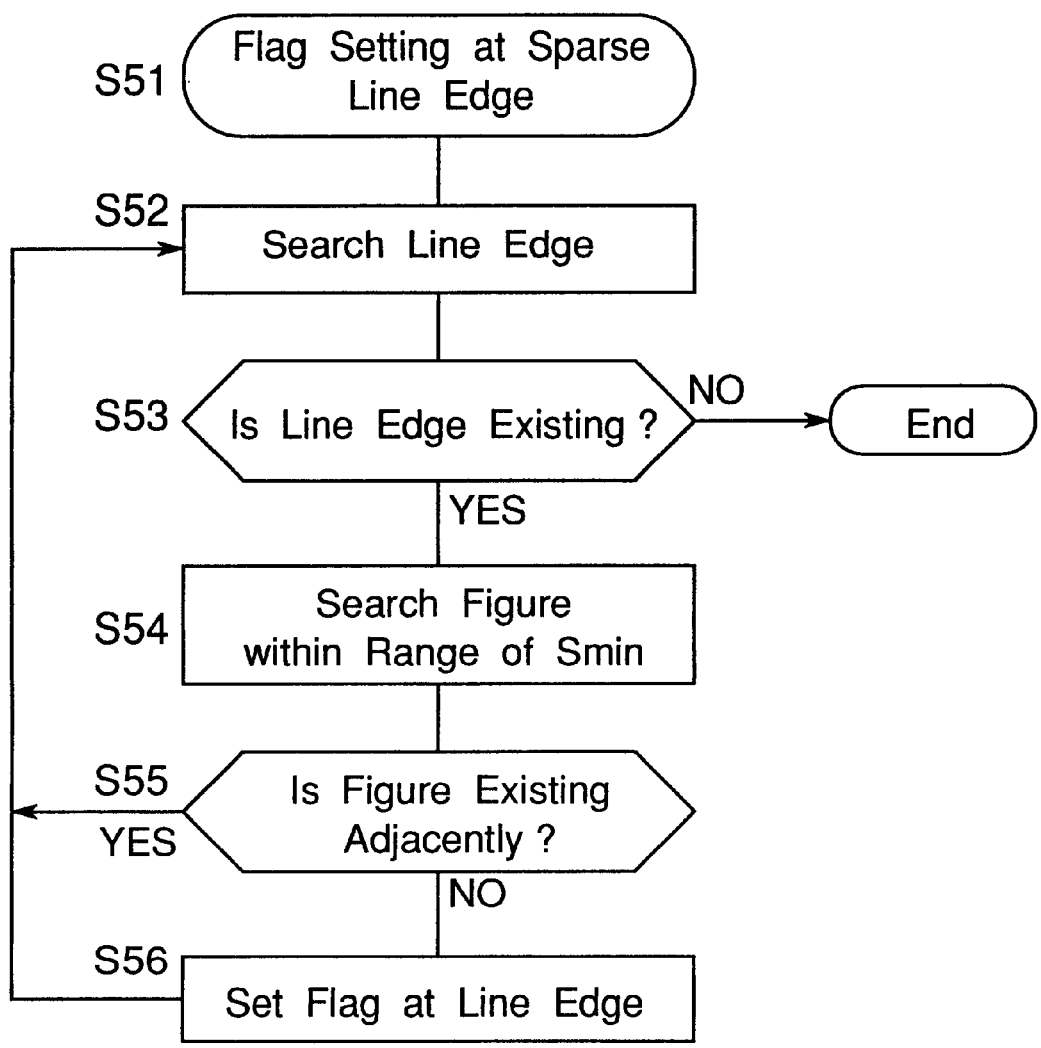
FIG. 13 is a flow chart showing the processing of a fifth verification example by means of a layout verifying apparatus according to an embodiment of the present invention.

The flow for detecting a vector in a sparse state in the mask pattern verifying apparatus of the present invention is shown in FIG. 13.

That is, in step S51, a flag is set at the line edge in a sparse state.

Next, in step S52, the line edge is searched.

Then, it is decided in step S53 whether or not a line edge exists. When a line edge exists, the program flow proceeds to step S54. When no line edge exists, the program flow ends.

Next, in step S54, a figure existing within the range of Smin is searched.

It is decided in step S55 whether or not a figure exists adjacently. When a figure exists, the program flow proceeds to step S52. When no figure exists, a flag is set at the line edge, and the program flow proceeds to step S52.

Therefore, according to the present apparatus, the search within the range of Smin from the reference vector is only required to be executed. Therefore, the worst situation such that the whole layout is searched as observed in the case of the first prior art method can be avoided. Furthermore, the differential calculation between large figure sets as observed in the case of the second prior art method is not necessitated, and therefore, the hierarchical structure can be maintained, obviating the need for the vast amount of graphic processing resources.

An example of the description of the rule is shown below. First, an upward vector or a leftward vector is selected as the reference vector from all the vectors belonging to the vector set to be verified.

```
SELECT_VECTOR Vector ALL {
    ANGLE=90, 180
}MEMORY=Vup
```

Next, when no vector reverse to the reference vector is discovered within a range of 3.0 μm on the negative side of the reference vector, the pattern is regarded as an isolated pattern and outputted.

```
DISTANCE_VECTOR Vector ALL Vup {
    RANGE=[0, 3.0]
    FLAG=REVERSE
    SEARCH=NEGATIVE
    RELATIVE_ANGLE=180
    LEVEL=1
}FILE=OutFile (100)
```

According to the above rule, only the isolated pattern (of which the interval to the adjacent line is not smaller than Smin) is extracted from the patterns parallel to the X- and Y-axes.

What is claimed is:

1. A layout verifying method for converting a layout figure on a semiconductor integrated circuit into vector data by means of vectors corresponding to the sides of the layout figure and verifying whether or not the layout figure conforms to a design rule on the basis of said vector data, said method comprising:

a reference vector selecting step for selecting a reference vector which serves as a verification reference by its direction among vectors corresponding to said sides;

a verification object vector selecting step for executing search in a specified direction from said reference vector among said vectors corresponding to said sides and selecting an object vector to be verified; and a verifying step for verifying a distance between each reference vector and said object vector to be verified, wherein said verifying step includes making a new reference vector of an error vector outputted as an error and selecting a new object vector to be verified in correspondence with said new reference vector among said vectors corresponding to said sides and executing verification by a distance between said new reference vector and said new object vector to be verified corresponding to said new reference vector and a distance obtained through the above verification.

2. The layout verifying method according to claim 1, wherein said object vector to be verified is selected on the basis of the magnitude of an angle between said object vector to be verified and said reference vector in said verification object vector selecting step.

3. The layout verifying method according to claim 1, wherein said object vector to be verified is selected on the basis of its direction and the number of vectors located between said object vector to be verified and said reference vector in said verification object vector selecting step.

4. A layout verifying method for converting a layout figure on a semiconductor integrated circuit into vector data by means of vectors corresponding to the sides of the layout figure and verifying whether or not the layout figure conforms to a design rule on the basis of said vector data, said method comprising:

a reference vector selecting step for selecting a reference vector which serves as a verification reference by its direction among vectors corresponding to said sides;

a verification object vector selecting step for executing search in a specified direction from said reference vector among said vectors corresponding to said sides and selecting an object vector to be verified; and a verifying step for verifying a distance between each reference vector and said object vector to be verified, wherein said verifying step includes deciding the presence or absence of said object vector to be verified within a prescribed range from said reference vector on the basis of a detected distance and outputting an error vector when no object vector to be verified exists within said prescribed range from said reference vector.

5. A layout verifying apparatus for converting a layout figure on a semiconductor integrated circuit into vector data by means of vectors corresponding to the sides of the layout figure and verifying whether or not the layout figure conforms to a design rule on the basis of the vector data, said apparatus comprising:

a reference vector selecting section for selecting a reference vector which serves as a verification reference by its direction among vectors corresponding to said sides;

a verification object selecting section for executing search in a specified direction from said reference vector among said vectors corresponding to said sides and selecting the object vector to be verified; and a verifying section for verifying a distance between each reference vector and said object vector to be verified, wherein said verifying section includes making a new reference vector of an error vector outputted as an error and selecting a new object vector to be verified in correspondence with said new reference vector among said vectors corresponding to said sides and executing verification by the distance between said new reference vector and said new object vector to be verified corresponding to said new reference vector and a distance obtained through the above verification.

6. The layout verifying apparatus according to claim 5, wherein said object vector to be verified is selected on the basis of the magnitude of an angle between said object vector to be verified and said reference vector in said verification object vector selecting section.

7. The layout verifying apparatus according to claim 5, wherein said object vector to be verified is selected on the basis of its direction and the number of vectors located between said object vector to be verified and said reference vector in said verification object vector selecting section.

8. The layout verifying apparatus according to claim 6, wherein the presence or absence of said object vector to be verified within a prescribed range from said reference vector on the basis of a detected distance is decided and an error vector is outputted when no object vector to be verified exists within said prescribed range from said reference in said verifying section.

9. A layout verifying apparatus for converting a layout figure on a semiconductor integrated circuit into vector data using vectors corresponding to the sides of the layout figure and verifying whether or not the layout figure conforms to a design rule on the basis of the vector data, said apparatus comprising:

an input section receiving signals indicating the vectors corresponding to the sides of the layout figure;

a first selector operatively connected to said input section and arranged to select a reference vector which serves as a verification reference by its direction among vectors corresponding to said sides;

a second selector operatively connected to said input section and arranged to search in a specified direction from said reference vector among said vectors corresponding to said sides and to select an object vector to be verified; and a verifier operatively connected to said input section and arranged to verify a distance between each reference vector and said object vector to be verified, wherein said verifier is arranged to make a new reference vector of an error vector outputted as an error and arranged to select a new object vector to be verified in correspondence with said new reference vector among said vectors corresponding to said sides and arranged to execute verification by the distance between said new reference vector and said new object vector to be verified corresponding to said new reference vector and a distance obtained through the above verification.

10. The layout verifying apparatus according to claim 9, wherein said second selector selects said object vector to be verified on the basis of the magnitude of an angle between said object vector to be verified and said reference vector.

11. The layout verifying apparatus according to claim 9, wherein said second selector selects said object vector to be verified on the basis of its direction and the number of vectors located between said object vector to be verified and said reference vector.

12. A layout verifying apparatus for converting a layout figure on a semiconductor integrated circuit into vector data by means of vectors corresponding to the sides of the layout figure and verifying whether or not the layout figure conforms to a design rule on the basis of said vector data, said method comprising:

an input section receiving signals indicating the vectors corresponding to the sides of the layout figure;

a first selector operatively connected to said input section and arranged to select a reference vector which serves as a verification reference by its direction among vectors corresponding to said sides;

a second selector operatively connected to said input section and arranged to search in a specified direction from said reference vector among said vectors corresponding to said sides and to select an object vector to be verified; and a verifier operatively connected to said input section and arranged to verify a distance between each reference vector and said object vector to be verified, wherein said verifier is further arranged to determine the presence or absence of said object vector to be verified within a prescribed range from said reference vector on the basis of the detected distance and arranged to output an error signal when no object vector to be verified exists within said prescribed range.

* * * * *